United States Patent
Valosen et al.

[19]

[11] Patent Number: 6,038,131
[45] Date of Patent: Mar. 14, 2000

[54] ELECTRICAL COMPONENT MOUNTING ASSEMBLY INCLUDING SPECIAL GUIDE STRUCTURE FOR RECEIVING A COMPONENT PACKAGE REGARDLESS OF ORIENTATION OF THE PACKAGE RELATIVE TO THE GUIDES

[75] Inventors: Charles J. Valosen; Henry N. Wang, both of Huntsville; James A. Feemster, Arab; Donald H. Keagle, Huntsville; Richard M. Lagle, Union Grove; Jonathan N. Trotter, Huntsville, all of Ala.

[73] Assignee: SCI Systems, Inc., Huntsville, Ala.

[21] Appl. No.: 09/006,514

[22] Filed: Jan. 13, 1998

[51] Int. Cl.$^7$ .......................... H05K 7/10; H01R 13/629
[52] U.S. Cl. .......................... 361/756; 361/759; 439/64; 439/377
[58] Field of Search .................... 361/732, 740, 361/747, 754, 756, 759, 798, 801, 802, 741; 439/59, 61, 62, 64, 152, 153, 157, 160, 327, 328, 377; 312/183

[56] References Cited

U.S. PATENT DOCUMENTS

| | | |
|---|---|---|
| 4,080,031 | 3/1978 | Sawford-Atkins ................... 439/377 |
| 4,898,540 | 2/1990 | Saito ................................. 439/153 |
| 5,074,800 | 12/1991 | Sasao et al. ........................ 439/152 |
| 5,302,133 | 4/1994 | Tondreault ......................... 439/57 |
| 5,445,531 | 8/1995 | Billman et al. .................... 439/160 |
| 5,571,025 | 11/1996 | Arai et al. ......................... 439/160 |
| 5,829,601 | 11/1998 | Yurchenco et al. ............... 211/41.17 |
| 5,889,656 | 3/1999 | Yin ................................... 361/801 |
| 5,928,024 | 7/1999 | Ming-Huang ..................... 439/377 |

*Primary Examiner*—Leo P. Picard
*Assistant Examiner*—John B. Vigushin
*Attorney, Agent, or Firm*—Whitman Breed Abbott & Morgan LLP

[57] ABSTRACT

A mounting structure for mounting circuit components on circuit boards, and particularly for mounting packaged processors on computer mother-boards. The structure includes a pair of retractable guides for mounting the processor package onto the circuit board. The semi-finished circuit board can be prepared for further processing or transportation to a distant location by retracting the guides to greatly reduce the height and volume of each board. Then, when the boards are received, the guides can be erected and the processor package installed. The structure includes means for holding the guides erected to facilitate installation of the processor package, and holding the guides in folded position for processing and/or transportation. Also, each of the guides has a wall with two side-by-side latch openings for receiving offset latch members of the processor package regardless of the orientation of the package relative to the guides.

2 Claims, 3 Drawing Sheets

ELECTRICAL COMPONENT MOUNTING ASSEMBLY INCLUDING SPECIAL GUIDE STRUCTURE FOR RECEIVING A COMPONENT PACKAGE REGARDLESS OF ORIENTATION OF THE PACKAGE RELATIVE TO THE GUIDES

This invention relates to the mounting of electrical circuit elements on circuit boards, and specifically relates to the mounting of packaged processors in mounting structures on computer mother-boards.

Certain computer processors, such as the "Pentium II" processor sold by Intel, are packaged in relatively large, flat rectilinear packages. Such packages may contain not only a semiconductor processor chip, but other devices such as a cache memory, all mounted on a printed circuit board. The package is mounted on the mother-board of a P.C. or other computer in which the processor is to be used.

A mounting structure having edge guides is used for mounting the processor package on the mother-board. Because the processor package stands on its edge and is relatively tall, the edge guide structure is relatively tall.

Finished and semi-finished computer mother-boards are produced and sold in large quantities for use by others in assembling computers. The semi-finished boards often do not have the processor installed when shipped to the assembler because it is advantageous for the assembler itself to install the processor. However, the manufacturer of the semi-finished boards usually must attach the other components and the processor mounting structure to the boards before shipment to the customer.

Applicants have recognized that the transportation costs for shipping the semi-finished boards are unnecessarily high because of the significant extra packing volume required due to the upstanding processor edge guides.

Accordingly, one of the objects of the invention is to provide a new flexible structure and method for mounting electrical components such as processor packages on circuit boards; a structure and method which minimizes the dimensions of the boards when the electrical components are not installed in the mounting structure.

Prior mounting structures for the processor packages suffer from relatively inflexible structure, high manufacturing costs and lack of flexibility in the manner in which they can be attached to the circuit board.

Accordingly, it is another object of the invention to provide a mounting structure which is relatively simple and inexpensive to fabricate, and which can be mounted using a variety of relatively low-cost fasteners and fastening methods.

Prior mounting structures also suffer from another problem in that they require a specific orientation when mounted on the circuit board in order to ensure that the processor package will not face the wrong way. This slows the assembly process and increases the board reworking requirements, and therefore increases manufacturing costs.

A further object of the invention is to provide a mounting structure which overcomes the foregoing problems.

In accordance with the present invention, the foregoing objects are met by the provision of an electrical component support including at least one retractable support for the component on a circuit board. When the board is transported, wave soldered or otherwise processed, before the installation of the component on the support, the support is retracted so as to reduce the height and volume of each board, thereby saving considerably on handling and processing costs. Then, when the board is received at a second location, the support is erected and the electrical component is attached.

Preferably, the support comprises a pair of hinged support arms which fold down to retract for shipment, and fold up to receive the electrical component. The component preferably is a processor package which is supported on edge and extends outwardly from the board by a substantial distance.

Preferably, the mounting structure includes detent means for holding the arms erect to facilitate mounting of the electrical element. Also, a detent means preferably is provided for holding the arms in a folded position.

Each retractable arm preferably has a pair of side-by-side openings to receive a resilient latch element offset from the centerline of the edge of the package. This means that the arms can be identical to one another, thus reducing fabrication costs. Also, this feature makes the element easier to mount because the mounting structure can be secured to the board in either of two orientations instead of only one as in the past.

Mounting holes are provided such that any of several different kinds of standard fasteners can be used to secure the mounting structure to the board, thus further reducing board fabrication costs.

Specifically, the circuit board is a computer motherboard, and the package to be mounted contains a processor and can have a relatively large heat-sink attached to its outside surface.

The foregoing and other objects and advantages of the invention are set forth in or will be apparent from the following descriptions and drawings.

IN THE DRAWINGS

ELECTRICAL COMPONENT TO BE MOUNTED

Figure 1:
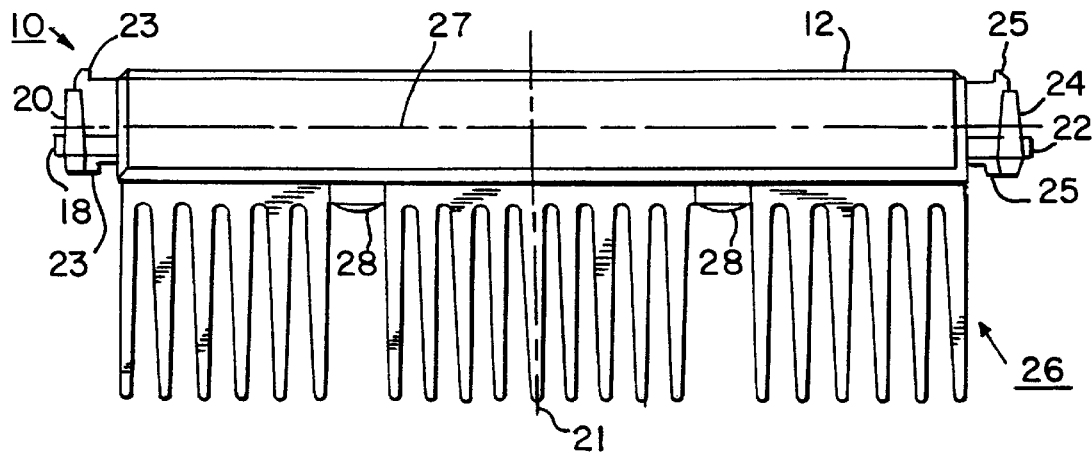
FIG. 1 is a top plan view of a typical processor package, with optional heat-sink, to be attached and electrically connected to the circuitry on a printed circuit board.
Figure 2:
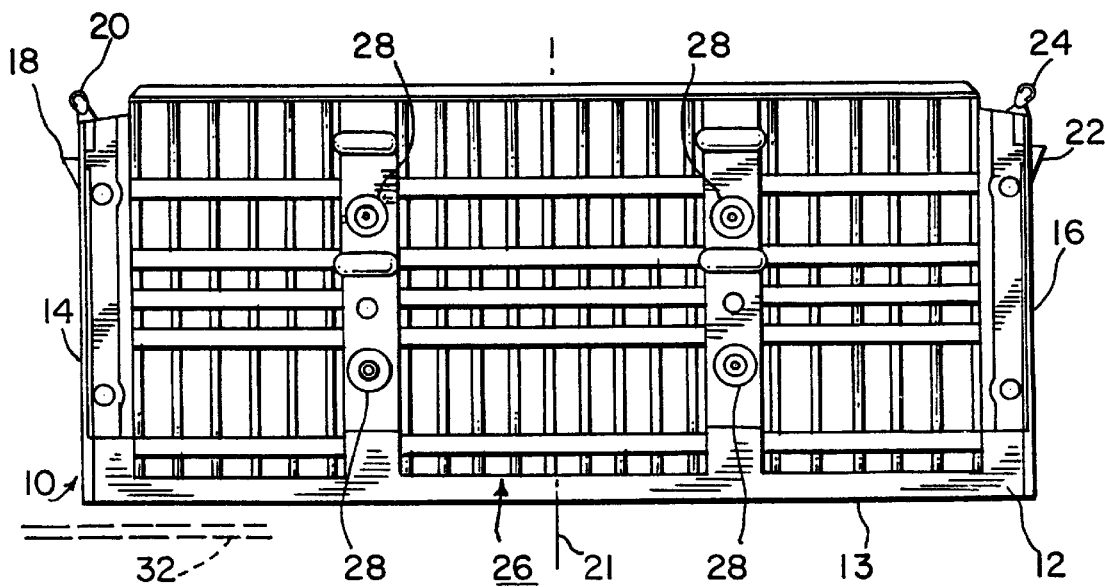
FIG. 2 is a front elevation view of the structure of FIG. 1.

FIGS. 1 and 2 show a packaged processor 10 which is to be mounted on a printed circuit board, specifically, a motherboard of a computer. The processor and heat-sink shown is sold under the trademark "PENTIUM II" by Intel Corporation.

The packaged processor 10 includes a housing 12 containing an integrated circuit processor chip on a printed circuit board, and other internal components not shown in the drawings. The lower edge of the printed circuit board has connection terminals extending along its lower edge, which is exposed near the bottom edge 13 (see FIG. 2) of the housing 12 and is adapted to plug into a receptacle 40 (FIG. 3 and FIG. 4) mounted on a circuit board so as to connect the processor and other circuitry inside the housing 12 to the circuitry of the mother-board.

The processor package 10 has opposed side edge walls 14 and 16 (FIG. 2) with spring-loaded latch members 18 and 22 extending outwardly from the edges 14 and 16, respectively. Levers 20 and 24 extend upwardly from recesses formed in the upper corners of the package. These levers can be pressed inwardly towards the centerline 21 of the package to depress the latch members 18 and 22 in order to remove the processor package from its holder.

Locating projections 23 and 25 are provided to mate with recesses in the mounting structure to properly locate the package in that structure.

An optional large heat-sink structure 26 is attached to the outside of the package by way of fasteners 28. The heat-sink structure 26 radiates heat away from the package 26 to keep the processor components at a satisfactory operating temperature.

The problems caused in mounting the packaged processor 10 on a circuit board are, first, that the package should be mounted on edge; that is, with the bottom edge 13 extending downwardly to a position closely adjacent the surface of the board, which is shown schematically in dashed lines at 32. Other problems are caused by the relatively large size and weight of the package 10, and the need to orient it on the circuit board correctly.

It should be understood that the specific processor package 10 shown in FIGS. 1 and 2 is merely an example of the many different forms and shapes the electrical components can take which can be mounted by means of the present invention. In particular, future versions of processor packages, edge-mounted printed circuit boards, and other such structures can be mounted on printed circuit boards with advantages similar to those obtained by the use of the invention with the specific package 10 shown in FIGS. 1 and 2.

MOUNTING STRUCTURE

Figure 3:
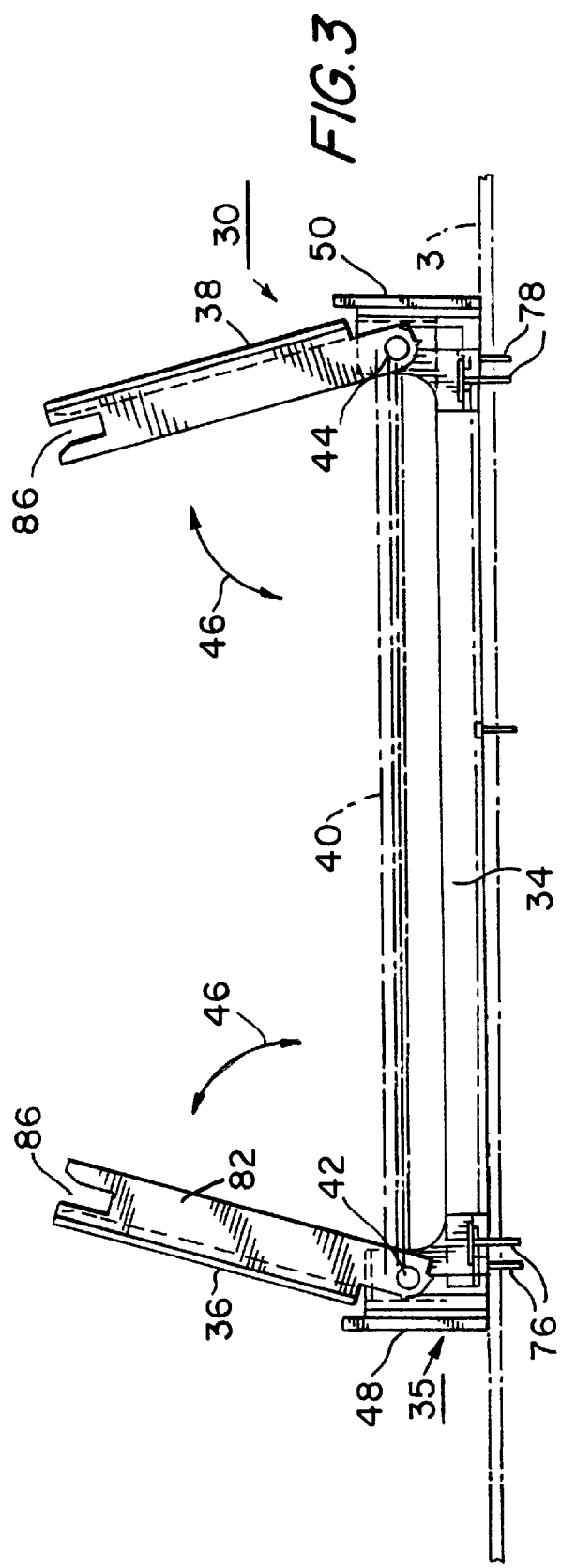
FIG. 3 is a side elevation view, partially in phantom, of a mounting structure constructed in accordance with the present invention.

FIG. 3 is a side-elevation view of a mounting structure 30 constructed in accordance with the present invention for mounting the processor package 10 and other such electrical components on printed circuit boards.

The mounting structure 30 shown in FIG. 3 includes a base structure 35, and two support arms 36 and 38 pivotally mounted at opposite ends of the base structure 35 by means of pins 42 and 44.

The arms 36 and 38 can be pivoted upwardly and downwardly, in the directions indicated by the arrows 46, to either erect the arms 36 and 38 or fold them downwardly into a retracted position in which they rise only a relatively short distance above the surface of the circuit board 32.

When the guide arms 36 and 38 are unfolded and erected, they move to a completely vertical position. They are shown in FIG. 3 in a position pivoted downwardly from vertical, for the sake of illustration.

The components of the mounting structure 30 preferably are molded of a suitable plastic material, such as ABS.

BASE STRUCTURE

Figure 4:
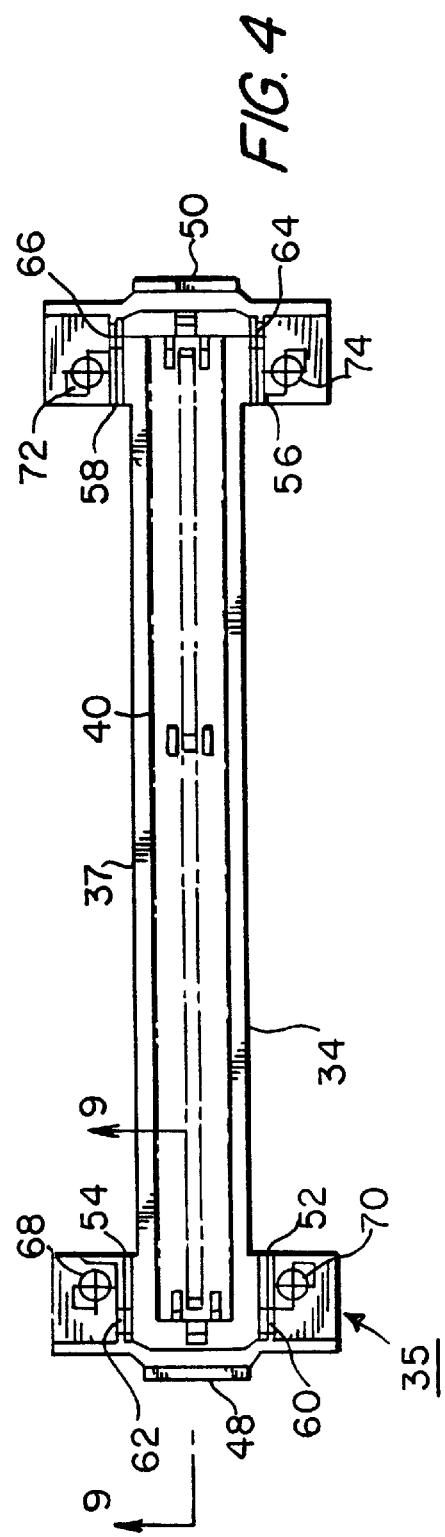
FIG. 4 is a top plan view of a portion of the structure shown in FIG. 3.

Referring to FIGS. 3 and 4, the base 35 includes end structures 48 and 50 with vertical spaced apart side-rails 34 and 37 extending between the end portions 48 and 50. The end portion 48 has a pair of spaced-apart vertically-extending walls 52 and 54, and the end portion 50 has similar vertical walls 56 and 58.

Figure 9:
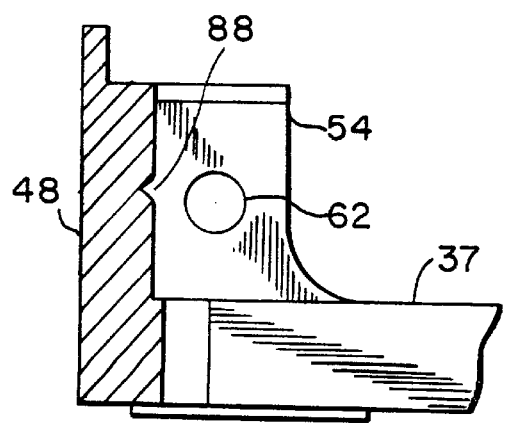
FIG. 9 is an enlarged, partially broken-away cross-sectional view taken along line 9—9 of FIG. 4.

The walls 52 and 54 have lateral holes 60 and 62, respectively (also see FIG. 9). Similarly, the walls 56 and 58 have lateral holes 64 and 66, respectively. The holes 60, 62, 64 and 66 are provided as pivot holes for the pivot pins 42 and 44.

Mounted on the printed circuit board 32 within the space between the side members 34 and 37 and the ends 48 and 50 is a rectangular connector 40 (shown in dashed outline) for receiving the edge of the printed circuit board at the bottom edge 13 of the processor package 10.

The connector 40 is a conventional connector, which is connected electrically to the circuitry on the board 32, and is secured mechanically to the board 32 in a conventional manner.

The receptacle 40 receives the lower edge of the printed circuit card in the package 10 when the package 10 is pressed downwardly against the connector. Since the connector will receive the printed circuit board with only one orientation, the orientation of the connector determines the proper orientation of the packaged processor 10.

Referring again to FIG. 4, the bottom members of the end structures 48 and 50 of the base 35 have conventional circular mounting holes 68, 70, 72 and 74. Conventional fasteners 76, 78 (FIG. 3) are used to secure the base 35 to the printed circuit board 32.

Figure 5:
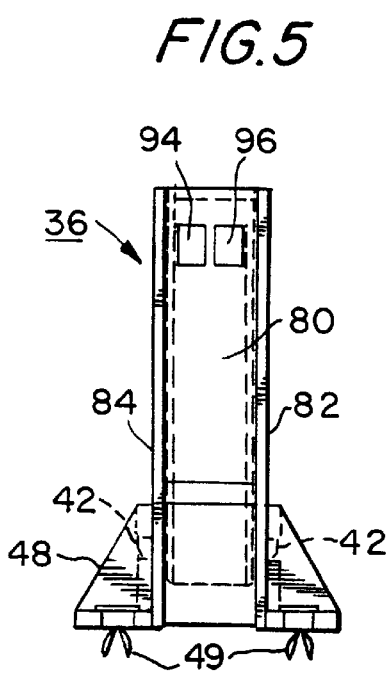
FIG. 5 is a left end elevation view of the structure of FIG. 4.

These fasteners can, for example, be conventional "push-pin" fasteners such as those shown at 49 in FIG. 5, or they can be pairs of bolts yoked together with a standard plastic yoke fitting on the underside of the circuit board, with ordinary nuts threaded onto the bolts, or the fasteners 76 and 78 can be locking solder tabs, as shown in FIG. 4, which can be wave-soldered to permanently hold them in place.

The ability of the holder of the invention to use such standard fasteners is in contrast to the most comparable prior art device, in which a special structure is provided to accommodate special nuts with holding clips.

GUIDE ARMS

The structure of the guide arms 36 and 38 is shown in FIGS. 5 through 8, as well as in FIG. 3.

Both guide arms 36 and 38 are illustrated by FIGS. 5 through 8, even though only one of the arms, arm 36, is shown in those figures. This illustrates one of the advantageous features of the invention in that both arms are identical.

Figure 7:
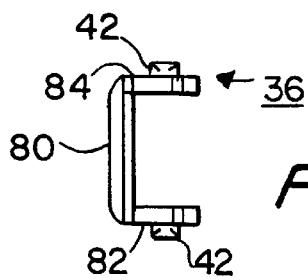
FIG. 7 is a top plan view of the arm shown in FIG. 6.
Figure 6:
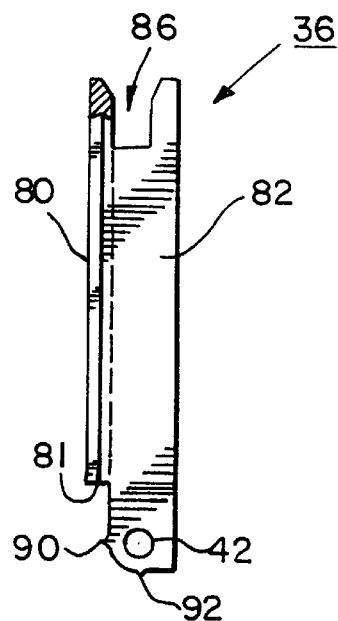
FIG. 6 is a side elevation view of one of the retractable arms of the structure of FIG. 3.

Referring to FIGS. 6 and 7, it can be seen that the arms 36 and 38 have a C-shaped cross-section, as shown in FIG. 7, thus forming a channel. This structure has side walls 82 and 84, and a web 80. The spacing between the walls 82 and 84 is wide enough so that those walls fit downwardly over the outside surfaces of the connector 40 when they are folded down.

The web 80 is cut away at the lower portion of the arm as indicated at 81 in FIG. 6. This is done to provide clearance for part of the structure of the end portion 48 of the base 35.

The upper edges of the side walls 82 and 84 are deeply notched to form a recess 86 which receives the guide projections 23 so as to properly locate the package 10 when it is inserted into the guide arms 36 and 38. As it is shown in FIG. 7, the pins 42 are relatively short, cylindrical projections molded integrally with the arms 36 and 38.

As it is shown in FIG. 5, a pair of latch holes 94 and 96 is formed in the upper portion of the web 80 to receive the latch element 18 or 22 (see FIGS. 1 and 2) of the processor package 10.

When the processor package 10 is inserted downwardly between the arms 36 and 38, the latch members 18 and 22, which are held outwardly by spring force, are depressed and then snap into one of the holes 94 and 96 in each arm 36 or 38 to lock the package into the mounting structure.

As it can be seen in FIG. 1, the latch members 18 and 22 are offset to one side of the centerline 27 of the package 10.

Prior package mounting structures typically have only one offset hole in the vertical mounting arm to receive one of the latch members 18 or 22. The purpose of this, it is believed, is to make certain that the processor package 10 has the proper orientation in the holder. Thus, two different fixed guide arms usually must be provided.

Applicants have recognized that this is unnecessary, because the connector 40 will receive the edge of the printed circuit card of the unit 10 in only one orientation, and thus serves to properly orient the package.

By providing two holes 94 and 96, it not does not matter in which of two different orientations the mounting structure 30 is mounted on the circuit board. This makes the mounting process faster, and prevents the need for reworking the board to correct the mounting of the structure 30 on the board or mounting the incorrect arm (left or right) on the base structure when assembling the mounting structure.

This feature also saves considerable cost in that only one mold is needed to mold both of the identical arms 36 and 38.

DETENT MECHANISM

In accordance with another feature of the invention, a detent mechanism is provided to hold the guide arms 36 and 38 in a vertical position, so as to prevent them from rotating downwardly when it is desired to insert a processor package into the mounting structure 30. Another detent is provided to hold the arms folded downwardly for shipment. The detent mechanism is illustrated in FIGS. 8 and 9.

Figure 8:
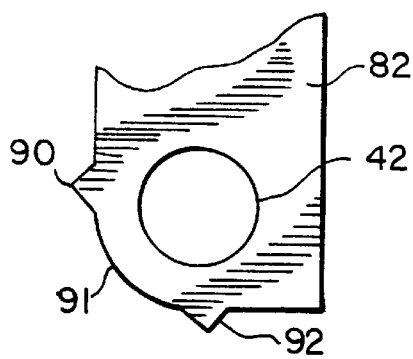
FIG. 8 is an enlarged broken-away view of the lower end of the FIG. 6 structure.

FIG. 8 is an enlarged, broken-away view of the lower end of the guide arm 36 shown in FIG. 6. The lower left-hand edge 91 has a circular shape, and two pointed projections 90 and 92 are spaced about 90° from one another.

Referring now to FIG. 9, the inner wall of the end 48 of the base 35 has a recess 88 shaped to receive the projections 90 or 92.

When the arm 36 is in its erect position, the projection 90 fits into the recess 88 and this tends to hold the arm erect.

When the arm 36 is folded downwardly, the projection 92 moves into the recess 88 and this tends to hold the arm in its retracted position.

It should be understood that the detent mechanism also can be constructed by forming a projection at 88 in FIG. 9 instead of a recess, and by providing recesses at 90 and 92 to mate with the projection.

It can be seen from the foregoing that the mounting structure described above meets the objects set forth above admirably.

Because the mounting structure has retractable arms, the height of circuit boards bearing the mounting structures can be reduced very substantially, thus substantially reducing the volume occupied by the boards during transportation to a separate location at which the processor package is added.

Furthermore, the manufacturing of the mounting structure 30 is simplified and made less costly by the use of identical guide arms and holes for mounting the device using standard fasteners.

A detent mechanism is provided for holding the arms up after they have been erected, thus facilitating installation of the processor package, and for holding the arms in the downward position to keep them from rising up during transportation.

The above description of the invention is intended to be illustrative and not limiting. Various changes or modifications in the embodiments described may occur to those skilled in the art. These can be made without departing from the spirit or scope of the invention.

What is claimed is:

1. A support structure for supporting a processor package extending outwardly from a circuit board, said package having opposed rectilinear edges each with a vertical centerline and a spring latch member offset to one side of said centerline, said support structure comprising a pair of substantially identical elongated edge guides shaped to receive and hold said rectilinear edges, each having a wall with two side-by side openings for receiving one of said latch members regardless of the orientation of said package relative to said edge guides.

2. A circuit element support for mounting an element on a circuit board with said element extending outwardly from said board by a substantial distance, said circuit element having rectilinear edges shaped to fit into channel-shaped guides, a pair of spaced-apart retractable channel-shaped guides mounted on said board, each of said guides comprising a base member secured to said board and an arm hinged to said base member to fold down when not in use, and to fold outwardly to receive said element, an electrical receptacle for receiving and engaging a connector array on said element when inserted into said channel-shaped guides in which each of said guides has two side-by-side latch openings, each dimensioned to receive an offset latch member on one of said edges of said circuit element regardless of the direction of the offset and regardless of the orientation of said guides relative to one another.

\* \* \* \* \*